United States Patent
Sheen et al.

(10) Patent No.: US 11,539,355 B2
(45) Date of Patent: Dec. 27, 2022

(54) SYSTEMS AND METHODS FOR GENERATING A CONTROLLABLE-WIDTH PULSE SIGNAL

(71) Applicant: Taiwan Semiconductor Manufacturing Company Limited, Hsinchu (TW)

(72) Inventors: Ruey-Bin Sheen, Taichung (TW); Ming Hsien Tsai, New Taipei (TW); Chih-Hsien Chang, New Taipei (TW); Tsung-Hsien Tsai, Taoyuan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 42 days.

(21) Appl. No.: 17/313,091

(22) Filed: May 6, 2021

(65) Prior Publication Data
US 2021/0258003 A1     Aug. 19, 2021

Related U.S. Application Data

(62) Division of application No. 16/733,379, filed on Jan. 3, 2020, now Pat. No. 11,031,927.

(60) Provisional application No. 62/867,328, filed on Jun. 27, 2019.

(51) Int. Cl.
| | |
|---|---|
| *H03K 5/14* | (2014.01) |
| *H03K 5/131* | (2014.01) |
| *H03K 5/135* | (2006.01) |
| *G04F 10/00* | (2006.01) |
| *H03K 5/00* | (2006.01) |

(52) U.S. Cl.
CPC ............. *H03K 5/14* (2013.01); *G04F 10/005* (2013.01); *H03K 5/131* (2013.01); *H03K 5/135* (2013.01); *H03K 2005/00058* (2013.01)

(58) Field of Classification Search
CPC .......... H03K 5/131; H03K 5/14; H03K 5/133; H03K 5/134; H03K 2005/00019; H03K 2005/00058; G04F 10/005
See application file for complete search history.

(56) References Cited

U.S. PATENT DOCUMENTS

| | | | |
|---|---|---|---|
| 2008/0172193 A1* | 7/2008 | Rhee ................ | G01R 31/31709 702/69 |
| 2010/0118626 A1 | 5/2010 | Maeda | |

FOREIGN PATENT DOCUMENTS

| TW | I437817 | 5/2014 |
|---|---|---|

OTHER PUBLICATIONS

Mu, Fenghao, Svensson, Christer; Pulsewidth Control Loop in High-Speed CMOS Clock Buffers; IEEE Transactions on Solid State Circuits, 35(2); pp. 134-141; Feb. 2000.
(Continued)

*Primary Examiner* — Patrick C Chen
(74) *Attorney, Agent, or Firm* — Jones Day

(57) ABSTRACT

Systems, methods, and devices are provided for a circuit for generating a pulse output having a controllable pulse width. Systems and methods may include a delay line having a plurality of stages. A delay per stage calculation circuit is configured to determine a per-stage delay of the delay line using a first clock input. A pulse generation circuit is configured to generate the pulse output using the delay line based on the per-stage delay using a second clock input, the second clock input having a lower frequency than the first clock input.

20 Claims, 10 Drawing Sheets

(56) References Cited

OTHER PUBLICATIONS

Taiwanese Notice of Allowance; Application No. 109121404; dated May 5, 2022.

\* cited by examiner

SYSTEMS AND METHODS FOR GENERATING A CONTROLLABLE-WIDTH PULSE SIGNAL

CROSS-REFERENCE TO RELATED APPLICATIONS

This application is a divisional application of U.S. patent application Ser. No. 16/733,379, filed Jan. 3, 2020, entitled "Systems and Methods for Generating a Controllable-Width Pulse Signal"; which claims priority to U.S. Provisional Application No. 62/867,328, filed Jun. 27, 2019, entitled "Low Power Digital Tunable Pulse-Width Generator," all of which are incorporated herein by reference in their entireties.

FIELD

The technology described in this disclosure relates generally to electronic systems and more particularly to pulse signal generation.

BACKGROUND

Pulse signals are common mechanisms used in digital circuits for a variety of purposes, such as signaling memory read/write times, indicating the occurrence of an event, providing timing synchronization, etc. Proper function of a circuit often dictates that pulse signals be of the designated width. Pulses that are not provided for a long enough time may result in incomplete downstream processes or may not be detected at all. Pulses that are provided for too long a time may result in erroneous downstream circuit operation (e.g., what was meant to be a single pulse may be interpreted as multiple pulses). Thus accurate pulse duration (i.e., width) ensures proper function of a digital circuit. As circuit size scales down and operation speeds increase, power and circuit area efficiency in all aspects, including pulse generation, becomes important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
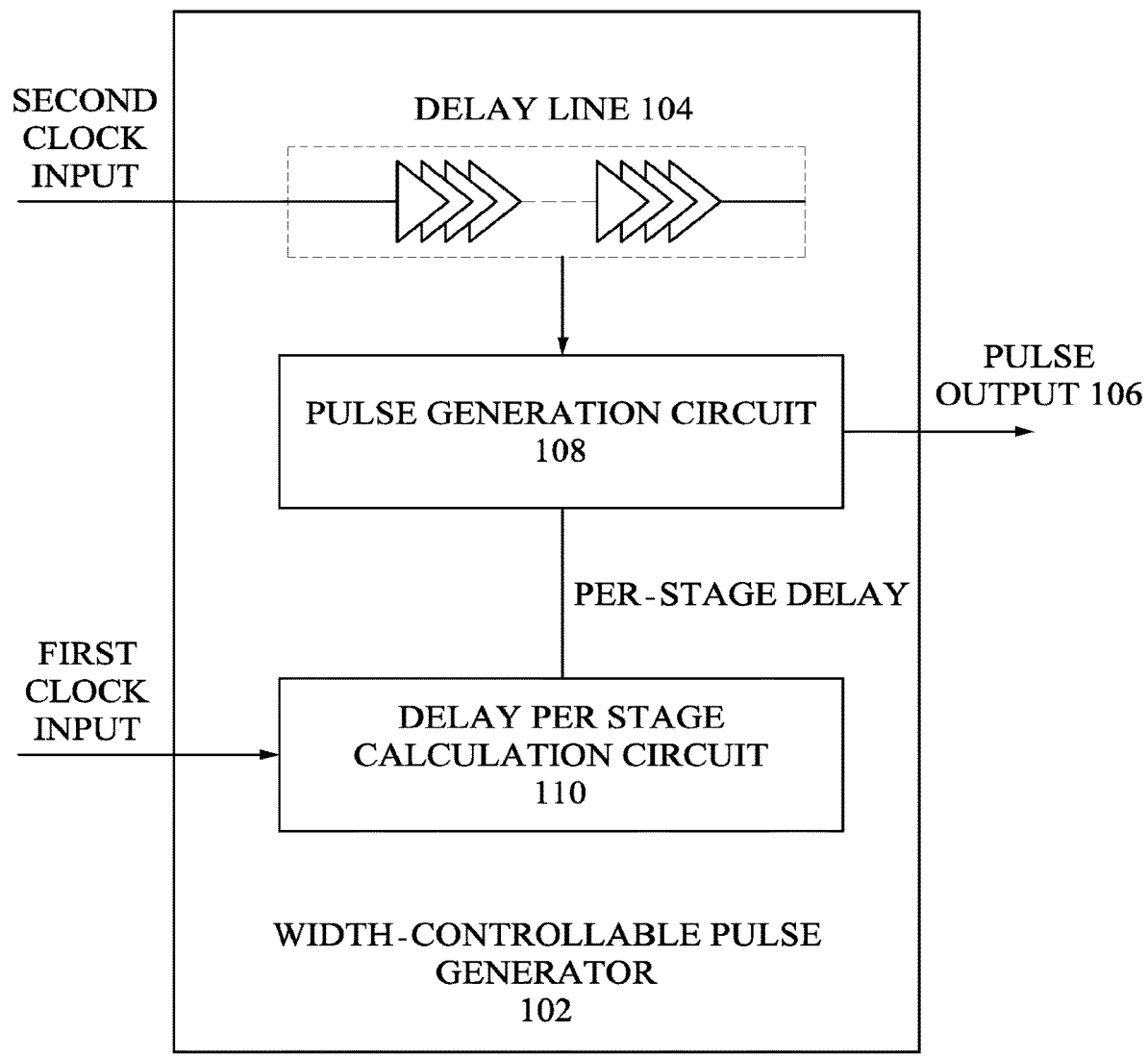
FIG. 1 illustrates an exemplary width-controllable pulse generator in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Traditionally, accurate pulse generation has been provided using high speed clocks, where a smallest producible pulse width is dictated by the clock frequency, or by large-area consuming solutions such as charge pump control loops. Such traditional approaches are inefficient in either/both of power and circuit area. Certain embodiments described herein utilize a delay line that includes a plurality of delay stages. The delay associated with one of those stages (a per-stage delay) is measured. A pulse of a desired width is produced using outputs of two of those delay line stages, where the precise stages to use in generating the pulse is determined based on the measured per-stage delay. In this manner, a smallest producible pulse width is based on the per-stage delay of the delay line (instead of an input clock frequency), enabling generation of an accurate small pulse width without the need for a power-consuming fast input clock.

FIG. 1 illustrates an exemplary width-controllable pulse generator in accordance with various embodiments of the present disclosure. A width-controllable pulse generator 102 utilizes a delay line 104 to generate a pulse output 106 using a pulse generation circuit 108. In embodiments, the pulse output width is always the same and is pre-programmed into the pulse generation circuit 108. In other embodiments, the desired pulse width is controllable (e.g., via an input to the pulse generation circuit 108) and can be controlled on-the-fly during operation of the pulse generator circuit 102.

The delay line 104 in embodiments is made up of a plurality of delay stages (e.g., buffer stages) connected in series. Outputs from each of those stages may be available to the pulse generation circuit 108 via tap lines. Outputs of two of the delay line 104 stages are selected to generate the pulse output 106 having the desired width, where selection of different stages results in a pulse of different width, where in some embodiments the pulse generation circuit 108 utilizes a per-stage delay determined by a delay per stage calculation circuit 110.

Figure 2:
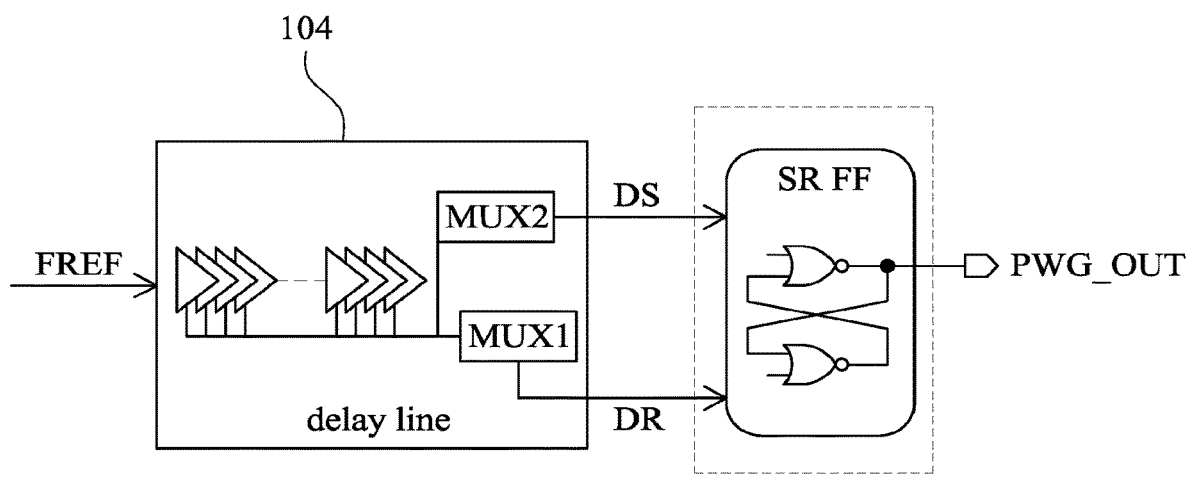
FIG. 2 illustrates an exemplary circuit for generating a pulse output based on outputs of two selected stages of the delay line in accordance with various embodiments of the present disclosure.
Figure 3:
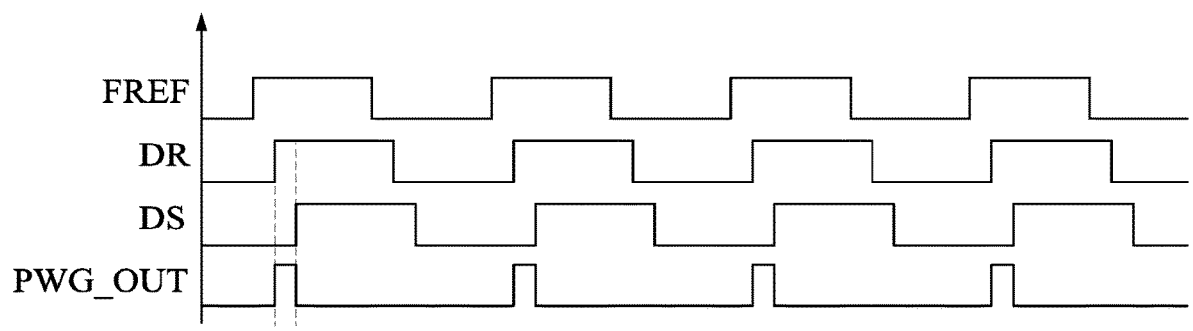
FIG. 3 illustrates an exemplary timing diagram of signals of a pulse generation circuit in accordance with various embodiments of the present disclosure.

FIG. 2 illustrates an exemplary circuit for generating a pulse output based on outputs of two selected stages of the delay line in accordance with various embodiments of the present disclosure. The delay line 104 is made up of a number of stages (e.g., buffer circuits represented by triangles, where each stage has an associated tap line from which its output may be individually accessed). The outputs of the selected stages are accessed via two multiplexers (MUX1, MUX 2) and provided to a SR (set-reset) flip flop, comprising, in this example, two NOR gates connected as illustrated, as inputs DR and DS to produce the pulse output as illustrated in FIG. 3.

By selecting outputs from different stages (e.g., outputs 1 stage apart, outputs 3 stages apart, outputs 8 stages apart), a pulse generation circuit 108 can selectably control the width of the generated pulse. FIG. 3 illustrates an exemplary timing diagram of signals of a pulse generation circuit 108 in accordance with various embodiments of the present disclosure. In the example of FIG. 3, a tapped output of a first stage of the delay line is provided to the DR input of the SR flip flop and a tapped output of a second stage of the delay line is provided to the DS input of the SR flip flop. Correspondingly, the SR flip flop outputs a pulse (PWG_OUT) having a width associated with the time difference between rising edges of the DR and DS inputs. By selecting a tap line of a different stage for the DS input (e.g., using MUX2 illustrated in FIG. 2), a pulse having a different width is output as PWG_OUT. For example, if a later stage is tapped and output to DS, the time between rising edges of DR and DS will be longer, resulting in a wider pulse output at PWG_OUT. In this way, the width of pulses generated by the pulse generation circuit 108 may be changed on the fly, such as based on a control signal received by the pulse generation circuit 108.

The delay line used to generate the output pulse is controlled by an input clock (FREF). As discussed further herein, this clock signal (sometimes referred to herein as a second clock input) can be implemented as a relatively slow clock (e.g., 50 MHz) having a frequency selected based on the frequency pulses need to be generated, where between 1 and (delay line stages/2) pulses can be generated per cycle of the FREF clock via pairs of taps of outputs of the delay line stages. The second clock frequency limits only the speed at which pulses can be generated, not the width of pulses, which depends on the delay associated with stages of the delay line rather than the FREF frequency. This offers potential for substantial power savings.

With reference back to FIG. 1, because the width of pulse outputs may be controlled based on per-stage delays of the delay line 104, it may be beneficial to have an accurate measurement of the per-stage delay. In practice, per-stage delays may vary from their design based on manufacturing process variances, location in larger circuits (e.g., parasitic capacitances), temperature, etc. Errors in per-stage delay accuracy can result in compounded errors in generated pulse widths because pulses are generated using differences in rising edge outputs of stages spaced N stages apart (e.g., an error of x seconds in per-stage delay accuracy could result in an N*x deviation from desired pulse width).

In embodiments, the per-stage delay may be measured, determined, or calculated once upon initialization of the width-controllable pulse generator 102. The per-stage delay may be determined based on interaction with the delay line 104 that provides the pulse output 106 or with a replica delay line (not shown in FIG. 1) that is similar to delay line 104 (e.g., has identical or similar stages as delay line 104, has identical or similar number of stages as delay line 104). The per-stage delay, in some embodiments, is determined using a first clock input, where in some instances the first clock input is a fast clock relative to the second clock input (e.g., 4 GHz, 5 GHz, 10 times faster, 20 times faster, 50 times faster, 100 times faster than the second clock input) used in generating the pulse during operation (i.e., after an initialization phase when the per-stage delay is determined). With knowledge of the per-stage delay determined by the delay per stage calculation circuit 110, the pulse generation circuit 108 can select outputs from appropriate stages of the delay line to generate a pulse output having a desired width.

Figure 4:
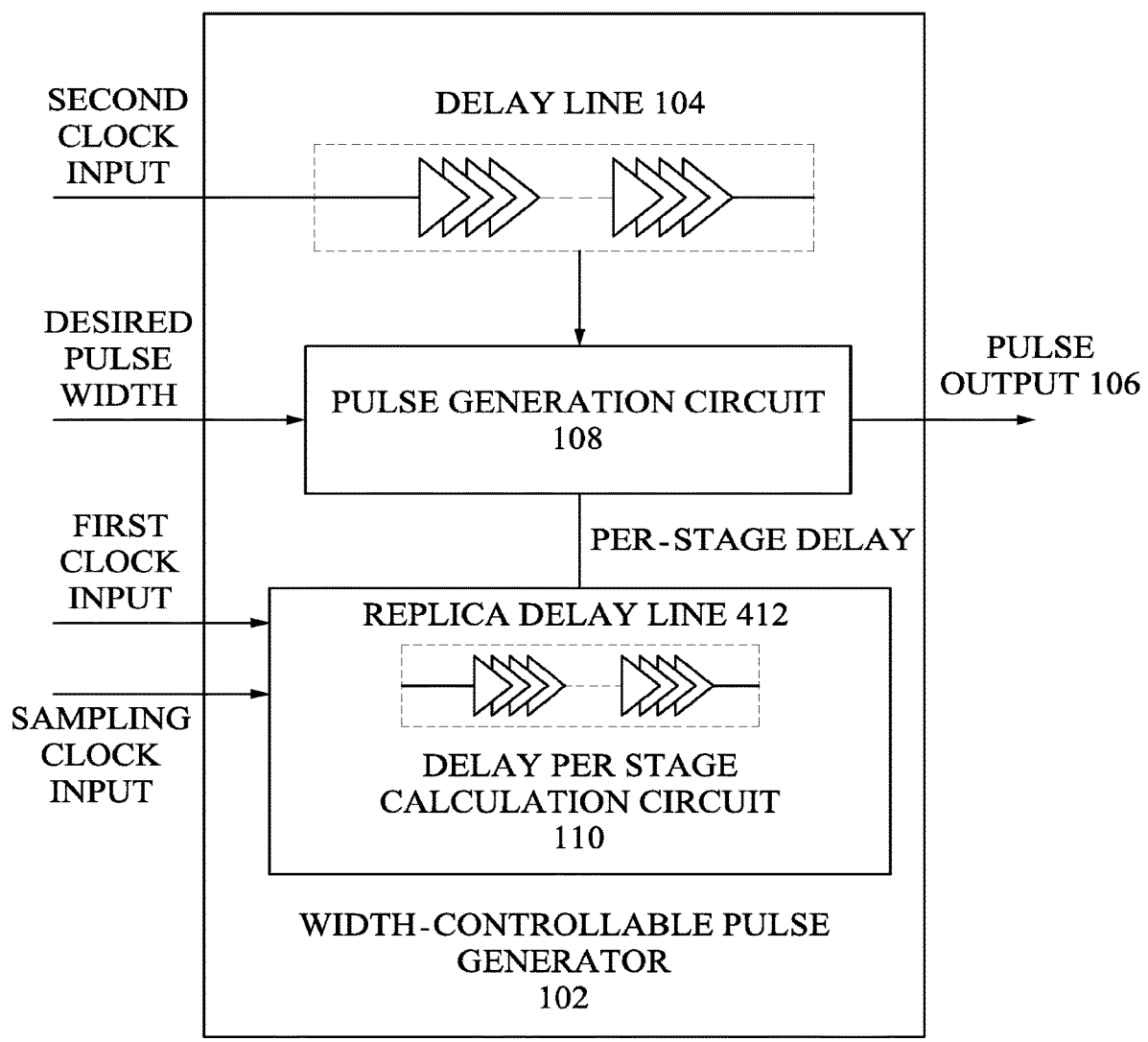
FIG. 4 illustrates an exemplary width-controllable pulse generator that utilizes a replica delay line to determine a per-stage delay in accordance with various embodiments of the present disclosure.

FIG. 4 illustrates an exemplary width-controllable pulse generator 102 that utilizes a replica delay line 412 to determine a per-stage delay in accordance with various embodiments of the present disclosure. While different delay lines will have differences in per-stage delay of some magnitude, typically that discrepancy will be small for delay lines positioned close to one another using a common fabrication process (e.g., they will have a similar process, experience similar parasitic capacitances, experience similar temperatures). Thus, a measured per-stage delay at the replica delay line 412 may be used as a proxy for the per-stage delay of the delay line 104. In the example of FIG. 4 the replica delay line 412 is controlled using a fast first clock input, with an output of the last stage of the replica delay line 412 being sampled according to a sampling clock input (e.g., 100 MHz, 50 MHz).

The per-stage delay may be calculated in a variety of ways. For example, the difference in time between a rising edge of the first clock input and a corresponding rising edge of the output of the replica delay line 412 may be determined and divided by the number of replica delay line 412 stages. But factors such as variances in duty cycles (e.g., of the first clock input and the sampling clock input) may result in inaccuracies using this method.

Figure 5:
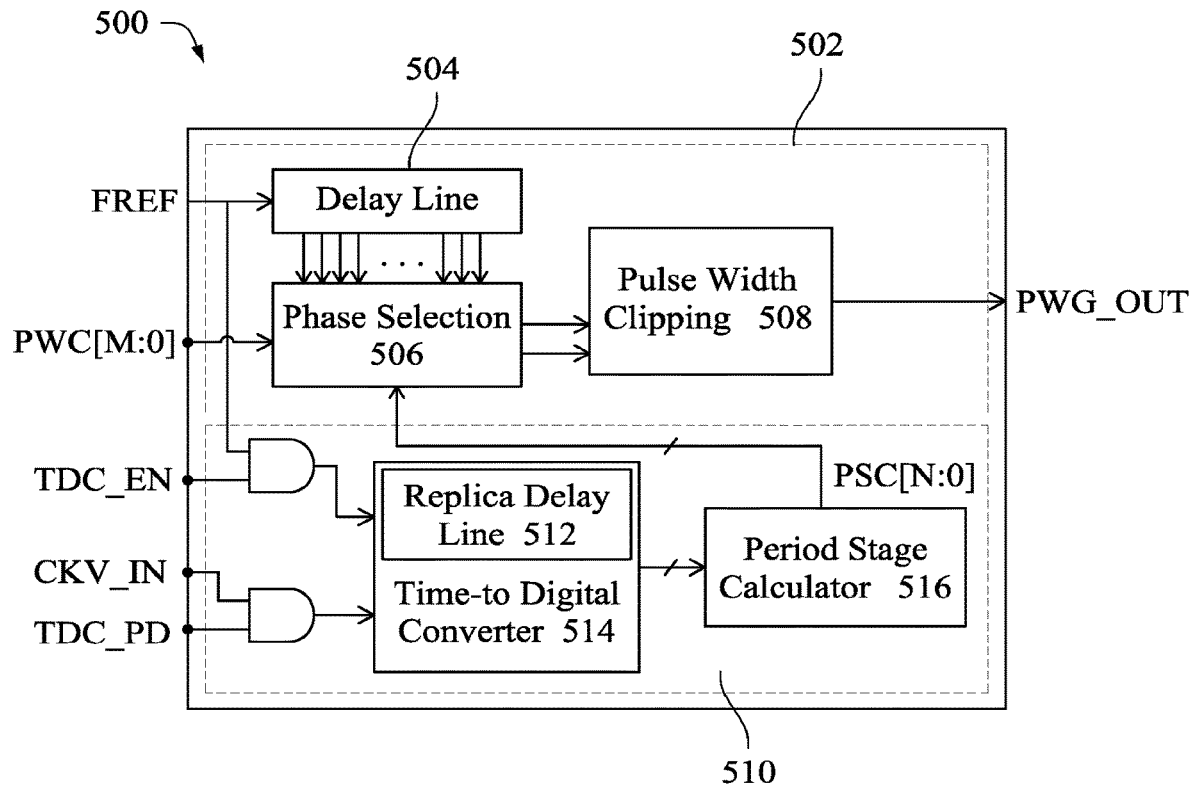
FIG. 5 illustrates an exemplary width controllable pulse generator that uses a time-to-digital convertor and period stage calculator to determine a per-stage delay in accordance with various embodiments of the present disclosure.

FIG. 5 illustrates an exemplary width controllable pulse generator that uses a time-to-digital convertor and period stage calculator to determine a per-stage delay in accordance with various embodiments of the present disclosure. The example embodiment of FIG. 5 executes a measurement of the per-stage delay (e.g., one time on initialization of the circuit). That measurement is then utilized in tuning the generation of the pulse output (PWG_OUT) to provide a pulse of an accurate, desired width, where that width is in some embodiments controllable (e.g., according to the PWC signal set based on a desired PulseWidth parameter). The pulse generator 500 of FIG. 5 includes a pulse generation circuit 502 that is configured to generate a pulse output (PWG_OUT) using a delay line 504, a pulse width clipping circuit 508 and a phase selection circuit 506. The delay line 504 includes a plurality of stages that each delay an input clock signal (FREF) an amount of time. The stages, in one embodiment, are serially connected such that each stage of the delay line 504 delays the FREF clock cycle one per-stage delay period longer. The outputs of each stage of the delay line 504, in addition to being provided to the next stage of the delay line 504, are accessible to the phase selection circuit 506. The generation circuit 502 uses a per-stage delay indication measurement PSC[N:0] provided by a delay per stage calculation circuit 510 to select signals from taps of particular stages of the delay line 504 according to PWC [M:0] to generate a pulse of a desired width (PulseWidth). The phase selection circuit 506 accesses outputs of two of the delay line 504 stages according to PWC[M:0] set based on the desired pulse width and the per-stage delay of each stage of the delay line 504 and provides those outputs to the pulse width clipping circuit 508 (e.g., an SR flip flop as illustrated in FIG. 2) to generate the pulse output (PWG_OUT).

The delay per stage calculation circuit 510 may be configured to determine a per-stage delay of the delay line 504 in a variety of ways. In some examples, the per-stage delay is determined based on measurements performed of the delay line 504. In the example of FIG. 5, the delay per stage calculation circuit 510 estimates the per-stage delay of the delay line 504 based on operations and measurements performed on a replica delay line 512. The replica delay line 512 being substantially similar to the delay line 504 (e.g., based on one or more of number of delay stages, type of delay stage, proximity in location on a fabricated circuit) provides a good indicator of behavior of the delay line 504. When enabled for per-stage delay calculation (e.g., one time during circuit initiation, periodically during circuit operation to ensure accurate circuit operation) via TDC_EN and TDC_PD, a time-to-digital converter 514 operates the replica delay line 512 using a first clock input CKV_IN. In some embodiments, the first clock is significantly faster than the second FREF clock signal used to generate pulses at PWG_OUT. For example, the first clock signal (CKV_IN) used in determining the per-stage delay may operate 10 times faster, 20 times faster, 50 times faster, 100 times faster than the second clock input (FREF), where in one example the first clock signal operates at 4-5 GHz and the second clock signal operates at 50 MHz. The time-to-digital converter 514 samples the output of the replica delay line 512 operated using the first clock signal (CKV_IN), with samples being taken according to a sampling clock frequency, which in the example of FIG. 5 is the second clock signal (FREF) used to operate the delay line 504 in generating the pulse output (PWG_OUT). In other examples, a different clock signal having a different (e.g., faster) clock signal may be used for sampling at the time-to-digital converter 514. The samples from the time-to-digital converter 514 are processed at the period stage calculator 516 to determine metric indicative of the per-stage delay (PSC[N:0]) that is transferred to and used by the phase selection circuit 506 in generating the pulse output (PWG_OUT).

Figure 6:
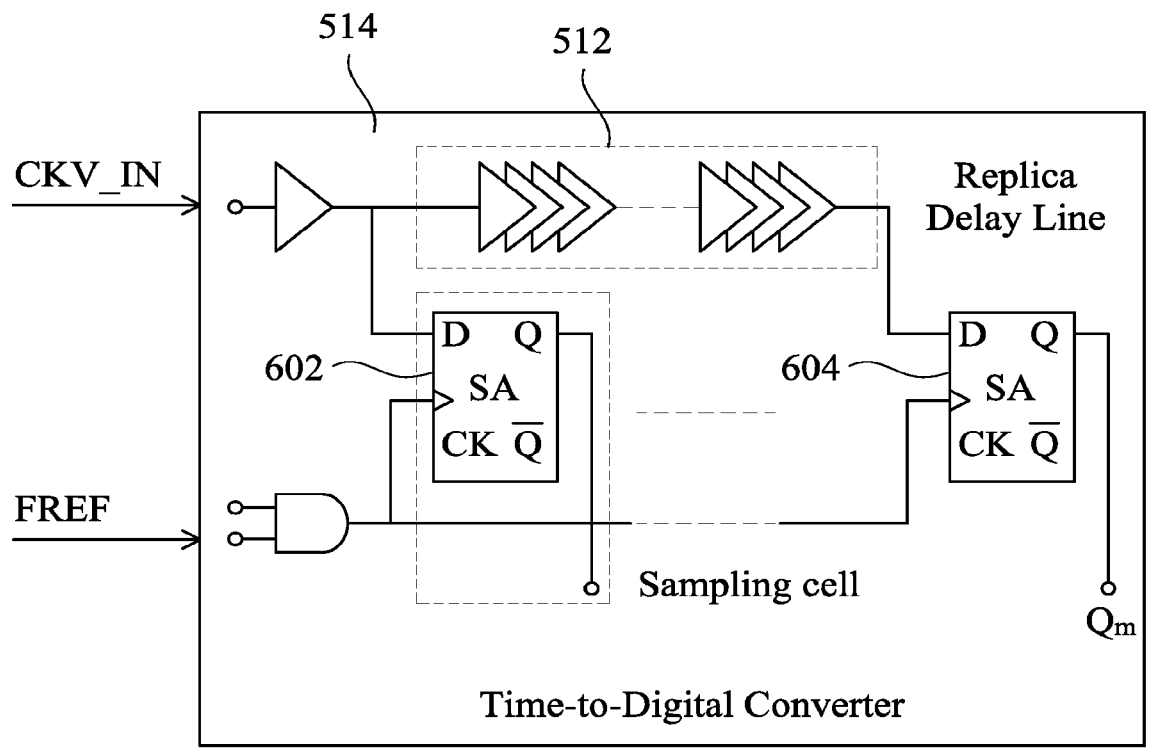
FIG. 6 illustrates an exemplary time-to-digital converter in accordance with various embodiments of the present disclosure.

FIG. 6 illustrates an exemplary time-to-digital converter in accordance with various embodiments of the present disclosure. The time-to-digital converter 514 operates the replica delay line 512 by providing it the first clock signal CKV_IN. A first sampling circuit 602 provides a first bit ($Q_0$) of a sampling array that is provided to the period stage calculator 516 based on the CKV_IN signal before it reaches the replica delay line 512. Subsequent sampling circuits (e.g., one associated with a tap output from each stage of the replica delay line 512 up to a final sampling circuit 604 associated with the last stage) provide subsequent bits ($Q_1$-$Q_N$) of the sampling array as controlled by the sampling clock input (FREF).

Figure 7:
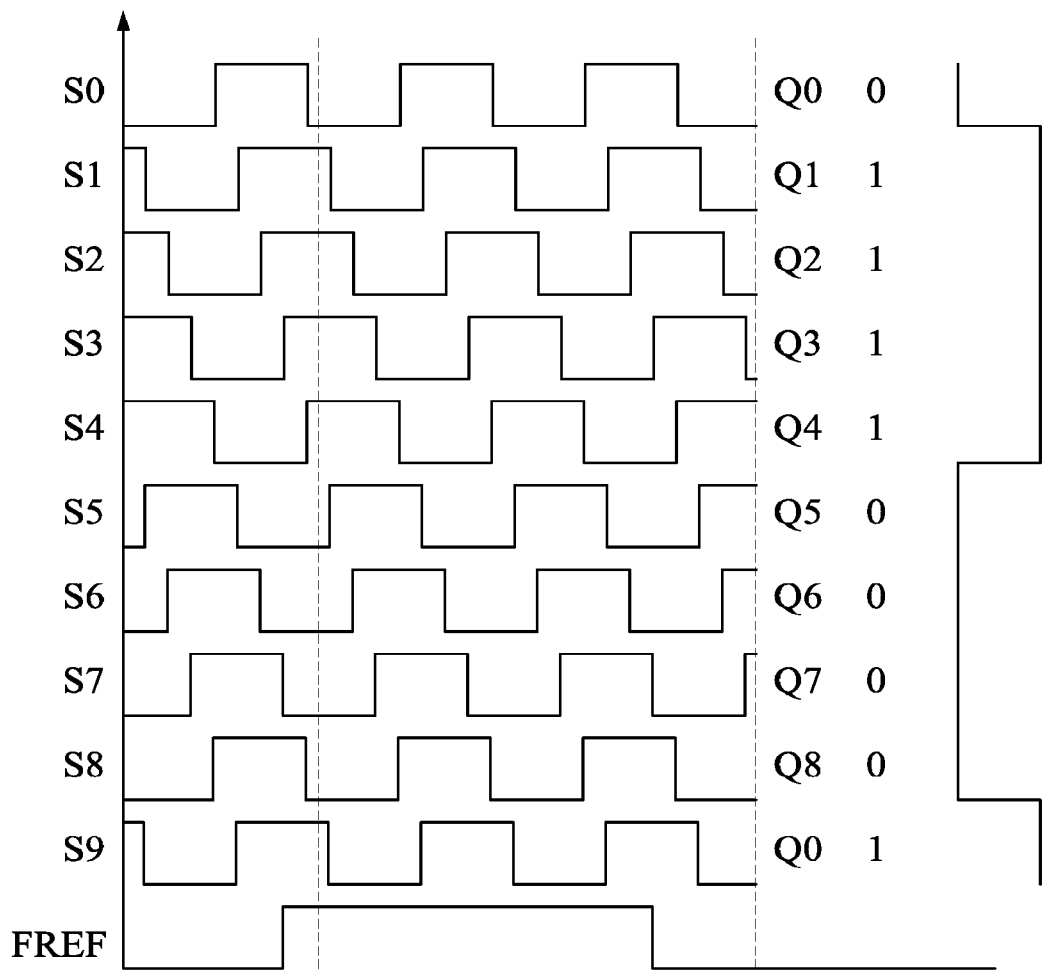
FIG. 7 illustrates an exemplary sampling array generated by a time-to-digital converter in accordance with various embodiments of the present disclosure.
Figure 8:
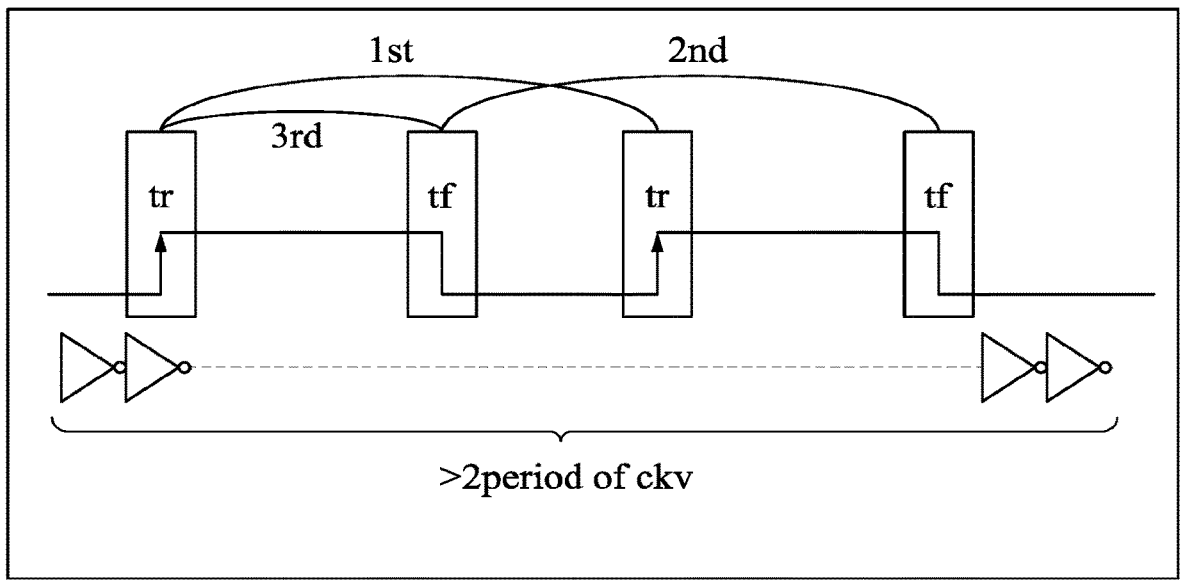
FIG. 8 illustrates different example definitions of a cycle of the sampling array in accordance with various embodiments of the present disclosure.

FIG. 7 illustrates an exemplary sampling array generated by a time-to-digital converter in accordance with various embodiments of the present disclosure. A rising edge of the sampling clock FREF is used as a trigger for sampling the states of each stage of the replica delay line. Those samples are represented as $Q_0$-$Q_N$ of the sampling array, which is provided to the period stage calculator 516. The period stage calculator 516 determines a number of stages of the replica delay line 512 that are associated with a cycle of the sampling array. FIG. 8 illustrates different example definitions of a cycle of the sampling array in accordance with various embodiments of the present disclosure, where a rising-to-rising cycle (i.e., represented by a transition from 0-1 to a subsequent 0-1 transition in the sampling array) or falling-to-falling cycle provide most accurate measurement of per-stage delay. A rising-to-falling cycle (i.e., represented by a transition from 0-1 to a next 1-0 transition) can be utilized but duty cycle variance could introduce inaccuracy in the per-stage calculation.

Using a rising-to-rising cycle in the example of FIG. 7, it takes eight replica delay line stage outputs $S_1$-$S_8$ for sampling array Q to transition from 0-1 back from 1-0 and then again from 0-1 (i.e., PSC[N:0]=8). The PSC value is provided to the phase selection circuit 506 that calculates the per-stage delay according to:

$$T_{stage}=(1/\text{frequency}(CKV_{IN}))/PSC[N:0]$$

The phase selection circuit then accesses outputs of two particular stages of the delay line 504 based on the per-stage delay $T_{stage}$ and a desired pulse width PulseWidth$_{PWG\_OUT}$ as commanded by control signal PWC. In one example, PWC is an array configured to have a 1 in a value associated with a delay line 504 stage that is selected as one input to the pulse width clipping circuit 508 along with a $0^{th}$ of $1^{st}$ stage as the second input to the pulse width clipping circuit 508. In one embodiment, the PWC array value to be populated with a 1 is determined according to:

$$PWC[M:0]=\text{PulseWidth}_{PWG\_OUT}/((1/\text{frequency}(CKV_{IN}))/PSC[N:0])$$

Figure 9:
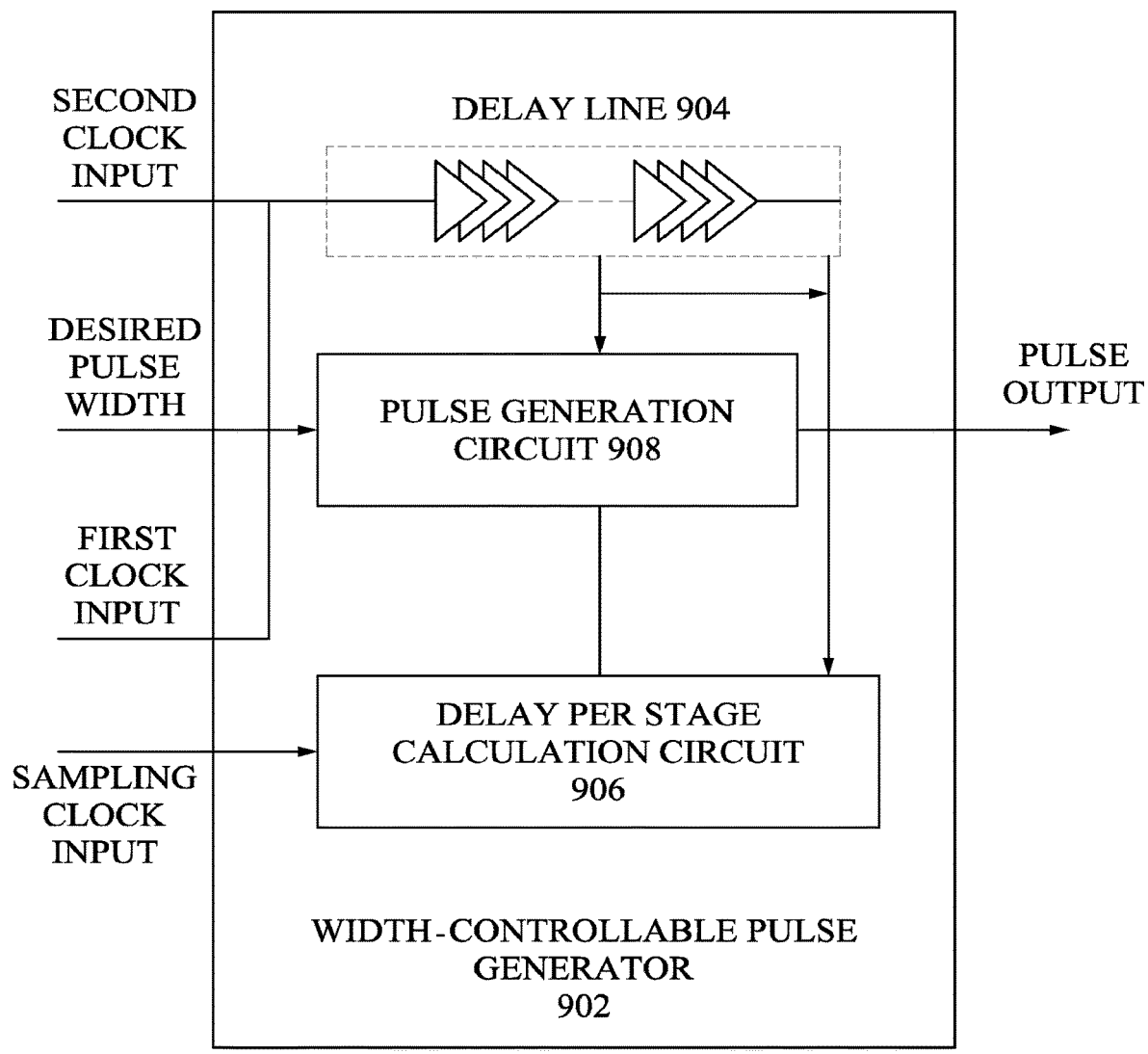
FIG. 9 illustrates an exemplary circuit for generating a pulse output that uses a single delay line.

As noted above, a circuit for generating a pulse output can be operated using a delay line and a replica delay line for estimating a per-stage delay. In some embodiments, the per-stage delay may be determined using a same delay line that is used to generate the pulse output. FIG. 9 illustrates an exemplary circuit 902 for generating a pulse output that uses a single delay line. During a per-stage delay calculation phase, the delay line 904 is operating using a first (e.g., fast) clock input, with outputs of the stages of the delay line being sampled according to a sampling clock input (e.g., the second clock input as described with reference to FIG. 5 above or a separate sampling clock) and provided to a delay per stage calculation circuit 906. The delay per stage calculation circuit 906 calculates a metric representative of a per-stage delay of the delay line 904 and provides that metric (e.g., PSC[N:0]) to a pulse generation circuit 908. The pulse generation circuit 908 uses the metric and a desired pulse width to select stages from which to tap outputs to generate the pulse output during operation (e.g., the $1^{st}$ and $5^{th}$ stage; the $0^{th}$ (before any stage) and the $7^{th}$ stage). The pulse generation circuit 908 accesses the outputs of the selected stages and uses those outputs to generate the pulse output (e.g., by providing the outputs of two selected stages to an SR flip flop as described above).

In certain embodiments, a pulse having a width substantially equal to the per-stage delay of the delay line 504 can be generated, where the width of the pulse is not dependent on the second clock signal. The second clock signal frequency merely dictates how often a pulse of that width can be generated (e.g., 1-N times per second clock signal period, where N depends on a number of available stages in the delay line).

Figure 10:
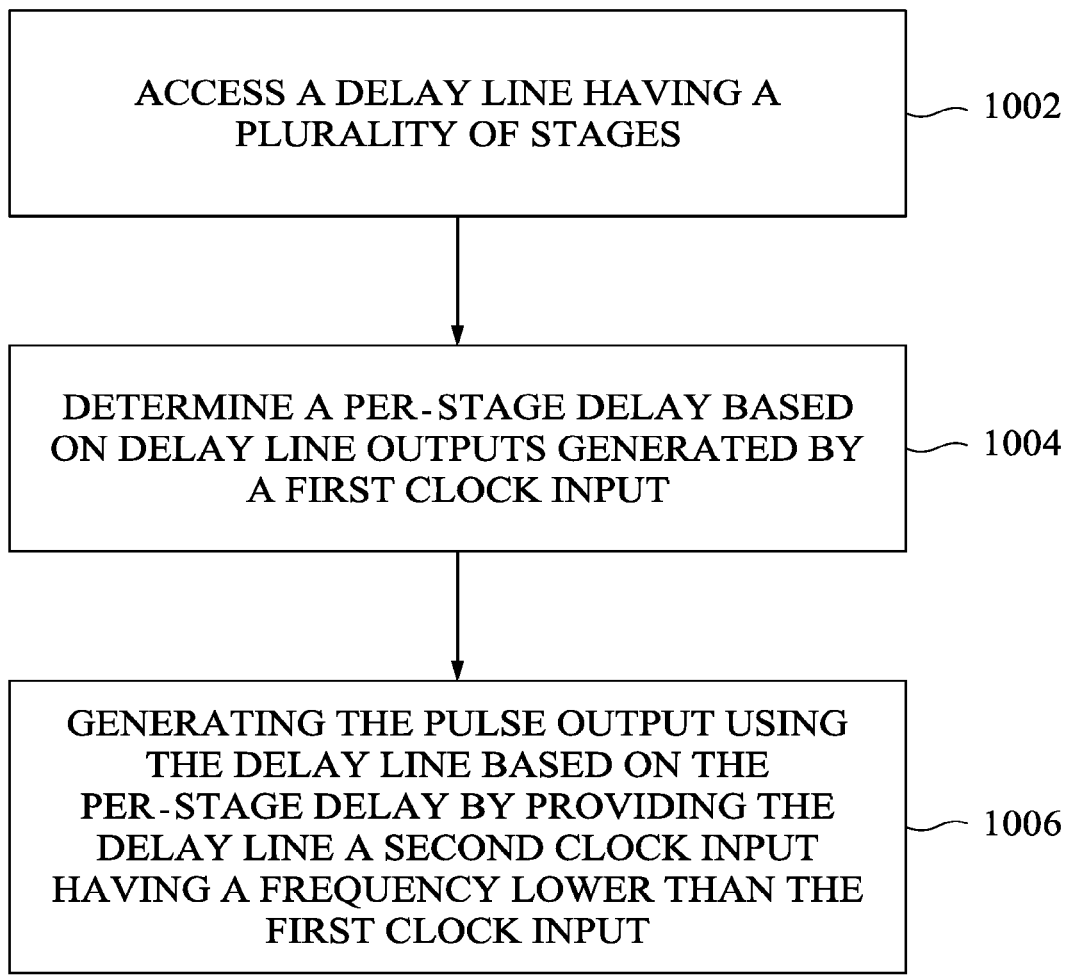
FIG. 10 is a flow chart of an exemplary method of generating a pulse output having a controllable width includes accessing a delay line having a plurality of stages.

FIG. 10 is a flow chart of an exemplary method of generating a pulse output having a controllable pulse width includes accessing a delay line having a plurality of stages. At 1002, a delay line having a plurality of stages is accessed. At 1004, a per-stage delay of the delay line is determined based on delay line outputs generated by a first clock input. The pulse output is generated at 1006 using the delay line based on the per-stage delay by providing the delay line a second clock input, the second clock input having a lower frequency than the first clock input.

Use of the various circuits and configurations as described herein can provide a number of advantages. For example, when a PLL operates in fractional-N mode there is increased jitter performance as the phase noise generated by the oscillator within the PLL is eliminated. Because the realignment functions with fractional-N mode, switching operation between fractional-N mode and integer-N mode becomes easy.

In one embodiment, a circuit for generating a pulse output having a controllable pulse width includes a delay line having a plurality of stages. A delay per stage calculation is circuit configured to determine a per-stage delay of the delay line using a first clock input. A pulse generation circuit is configured to generate the pulse output using the delay line based on the per-stage delay using a second clock input, the second clock input having a lower frequency than the first clock input.

In another embodiment, a method of generating a pulse output having a controllable pulse width includes accessing a delay line having a plurality of stages. A per-stage delay of the delay line is determined based on delay line outputs generated by a first clock input. The pulse output is generated using the delay line based on the per-stage delay by providing the delay line a second clock input, the second clock input having a lower frequency than the first clock input.

In a further embodiment, a circuit for generating a pulse output having a pulse width of a controllable length of time includes a delay line having a plurality of stages and a replica delay line having an identical number of stages as the delay line, the replica delay line stages being of identical type as those of the delay line. Aa delay per stage calculation circuit is configured to determine a per-stage delay of the delay line based on operation of the replica delay line using a first clock input, and a pulse generation circuit is configured to generate the pulse output using the delay line based on the per-stage delay using a second clock input.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for generating a pulse output having a controllable pulse width, comprising:
   a delay line having a plurality of stages;
   a replica delay line having stages substantially similar to the delay line;
   a delay per stage calculation circuit configured to determine a per-stage delay of the delay line using a first clock input and a sampling clock input;
   a pulse generation circuit configured to generate the pulse output by using the delay line and based on the per-stage delay;
   wherein the delay line receives a second clock input;
   wherein the delay per stage calculation circuit determines the per-stage delay of the delay line based on operation of the replica delay line receiving the first clock input.

2. The circuit of claim 1, wherein the delay per stage calculation circuit comprises:
   a time to digital converter configured to sample an output of the replica delay line according to the sampling clock input.

3. The circuit of claim 2, wherein the delay per stage calculation circuit comprises:
   a period stage calculator configured use the sampled output of the replica delay line to determine a number of sampling clock periods are in a cycle of the sampled output of the replica delay line.

4. The circuit of claim 3, wherein the per-stage delay is determined based on the determined number of sampling clock periods and the frequency of the first clock input.

5. The circuit of claim 1, wherein the second clock input having a lower frequency than the first clock input.

6. The circuit of claim 1, wherein the second clock input has a lower frequency than both the first clock input and the sampling clock input.

7. The circuit of claim 1, wherein the first clock input operates at a frequency of 4 to 5 GHz.

8. The circuit of claim 1, wherein the first clock input operates at a frequency 10 to 100 times faster than the second clock input.

9. A method of generating a pulse output having a controllable pulse width, comprising:
   accessing a delay line having a plurality of stages;
   providing a first clock input to a replica delay line having stages substantially similar to the delay line,
   sampling an output of the replica delay line using a sampling clock input,
   determining a per-stage delay of the delay line based on operation of the replica delay line; and
   generating the pulse output using the delay line based on the per-stage delay by providing the delay line a second clock input.

10. The method of claim 9, further comprising:
    determining a number of sampling clock periods are in a cycle of the sampled output of the replica delay line.

11. The method of claim 10, wherein the per-stage delay is determined based on the determined number of sampling clock periods and a frequency of the first clock input.

12. The method of claim 9, wherein the second clock input has a lower frequency than both the first clock input and the sampling clock input.

13. The method of claim 9, wherein the output of the replica delay line is sampled by a time-to-digital converter.

14. The method of claim 13, wherein a period stage calculator processes the samples from the time-to-digital converter to determine a per-stage delay indication measurement.

15. The method of claim 14, wherein the per-stage delay of the delay line is determined from the per-stage delay indication measurement.

16. A circuit for generating a pulse output having a controllable pulse width, comprising:
    a delay line having a plurality of stages;
    a delay per stage calculation circuit configured to determine a per-stage delay of the delay line using a sampling clock input;

a pulse generation circuit configured to generate the pulse output by using the delay line and based on the per-stage delay;

wherein the delay line receives a fast clock input;

wherein the delay per stage calculation circuit determines the per-stage delay of the delay line based on operation of the delay line receiving the fast clock input;

wherein the delay per stage calculation circuit comprises: a time-to-digital converter configured to sample an output of the delay line according to the sampling clock input; and a period stage calculator configured use the sampled output of the delay line to determine a number of sampling clock periods are in a cycle of the sampled output of the delay line.

17. The circuit of claim 16, wherein the pulse generation circuit selectively accesses outputs of two of the plurality of stages of the delay line based on the per-stage delay and a selected pulse width to generate the pulse output.

18. The circuit of claim 17, further comprising an SR flip flop that receives the outputs of the two stages and generates the pulse output.

19. The circuit of claim 17, wherein the two stages are selected based on a selected pulse output width and the per-stage delay.

20. The circuit of claim 16, wherein the fast clock input has a frequency of 4 to 5 GHz.

* * * * *